(12) United States Patent
Branch et al.

(10) Patent No.: US 6,916,122 B2
(45) Date of Patent: Jul. 12, 2005

(54) MODULAR HEAT SINKS

(75) Inventors: Scott Michael Branch, Rochester, MN (US); Eugene E. Distad, Mantorville, MN (US); Ladd W. Freitag, Rochester, MN (US); Michael Francis Hanley, Rochester, MN (US); David Peter Gaio, Rochester, MN (US)

(73) Assignee: JDS Uniphase Corporation, San Jose, CA (US)

( * ) Notice: Subject to any disclaimer, the term of this patent is extended or adjusted under 35 U.S.C. 154(b) by 229 days.

(21) Appl. No.: 10/367,278

(22) Filed: Feb. 14, 2003

(65) Prior Publication Data

US 2003/0169983 A1 Sep. 11, 2003

Related U.S. Application Data

(60) Provisional application No. 60/397,630, filed on Jul. 23, 2002, and provisional application No. 60/361,654, filed on Mar. 5, 2002.

(51) Int. Cl.$^7$ .................................................. G02B 6/36
(52) U.S. Cl. ........................ 385/92; 385/88; 257/675; 257/706; 257/717; 257/718; 257/720
(58) Field of Search ............................. 385/88, 92, 94; 257/675, 706, 717, 718, 720

(56) References Cited

U.S. PATENT DOCUMENTS

| | | | | |
|---|---|---|---|---|
| 5,202,943 A | * | 4/1993 | Carden et al. | 385/92 |
| 5,397,919 A | * | 3/1995 | Tata et al. | 257/717 |
| 5,808,236 A | | 9/1998 | Brezina et al. | 174/16.3 |
| 6,811,326 B2 | * | 11/2004 | Keeble et al. | 385/92 |

* cited by examiner

Primary Examiner—Kaveh C Kianni
Assistant Examiner—Derek L. Dupuis
(74) Attorney, Agent, or Firm—Allen, Dyer, Doppelt, Milbrath & Gilchrist, P.A.

(57) ABSTRACT

The invention relates to modular heat-dissipating housing covers for opto-electronic modules, e.g. transceivers. The housing covers according to the present invention are constructed out of various different parts, which provide different levels of heat dissipation depending on the desired implementation, while maintaining a seal against EMI leakage. Extra heat sinking portions are provided to dissipate heat generated from specific heat generating sources. The extra heat sinking portions are configured into a shape and/or out of a material that provides more thermal dissipation than the standard cover provided. Independent control over the different heat sinking portions enables a better fit and appropriate dissipation.

17 Claims, 6 Drawing Sheets

MODULAR HEAT SINKS

CROSS-REFERENCE TO RELATED APPLICATIONS

The present invention claims priority from U.S. patent applications Ser. Nos. 60/361,654 filed Mar. 5, 2002 and 60/397,630 filed Jul. 23, 2002.

TECHNICAL FIELD

The present invention relates to a heat sink for an opto-electronic device, and in particular to a modular heat sink cover for an optical transceiver providing both thermal dissipation and electromagnetic interference shielding.

BACKGROUND OF THE INVENTION

Opto-electronic devices, e.g. optical transceivers, include optical subassemblies (OSA) for converting electronic signals into optical signals and/or vice versa. Optical transceivers include a transmitter optical subassembly (TOSA), which includes a laser, and a receiver optical subassembly (ROSA), which includes a photodiode detector. Conventional transceivers have not required specially designed heat sinks, as the metal housings or the electromagnetic interference (EMI) shielding have provided sufficient heat dissipation. However, the latest generation of transceiver modules, which transmit at 10 Gb/s, include heat sources that generate heat that cannot be dissipated by normal means. Moreover, these heat sources are spread out over the transceivers printed circuit board, and extend upwardly therefrom by various amounts. An initial solution to this problem is to provide heat dissipating fins on the upper surface of the top cover of the module's housing, and to provide raised portions on the lower surface of the top cover for contacting the heat sources. This solution, while providing constant heat dissipation over the entire upper surface of the module's housing, does not provide any versatility for accommodating particularly hot heat sources. Moreover, it is very difficult to match the corresponding raised portions on the lower surface of the top cover with a plurality of heat sources without one or more of the contacts being less than optimum.

U.S. Pat. No. 5,808,236 issued Sep. 15, 1998 to Johnny Brezina et al discloses a high density heat sink attachment for mounting multiple heat sinks directly onto a printed circuit board. Unfortunately, the Brezina et al device does not provide an enclosure for the entire module. Moreover, since the heat sinks are held down only by torsion clips and do not completely seal the opening in the frame, the Brezina et al device does not ensure the proper EMI shielding.

An object of the present invention is to overcome the shortcomings of the prior art by providing a modular heat sink cover for an opto-electronic device that provides the versatility to accommodate for various heat sources, while providing sufficient EMI shielding.

SUMMARY OF THE INVENTION

Accordingly, the present invention relates to an opto-electronic device of the type for transmitting signals between an optical waveguide and a host computer comprising:

an optical sub-assembly for converting optical signals into electrical signals or electrical signals into optical signals;

a thermally conductive housing for supporting the optical sub-assembly;

an optical connector on one end of said housing for receiving the optical waveguide, and for aligning the optical waveguide with the optical sub-assembly;

a printed circuit board mounted in said housing including circuitry for controlling the optical sub-assembly, the printed circuit board including a first heat source; and an electrical connector extending from another end of said housing for transmitting electrical signals between the printed circuit board and the host computer.

The housing including: a lower portion for supporting the optical sub-assembly and the printed circuit board; a heat dissipating cover fixed on top of the lower portion for dissipating heat from inside the housing; and a first heat sink mounted on the heat dissipating cover above the first heat source for dissipating heat therefrom.

The heat dissipating cover and/or the first heat sink enclose and seal the housing to prevent leakage of electromagnetic interference (EMI) from the housing.

BRIEF DESCRIPTION OF THE DRAWINGS

The invention will be described in greater detail with reference to the accompanying drawings which represent preferred embodiments thereof, wherein.

DETAILED DESCRIPTION

Figure 1:
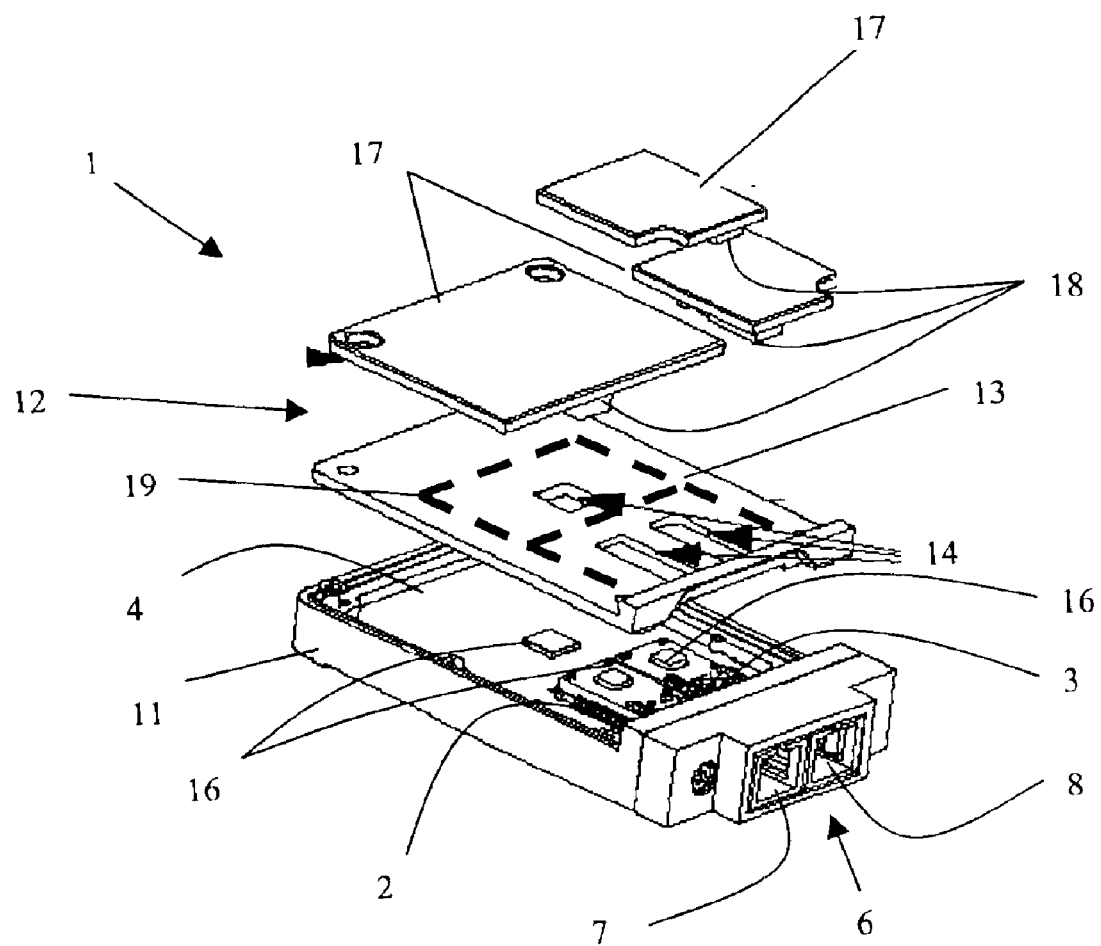
FIG. 1 is an exploded isometric view of a first embodiment of the present invention.

With reference to FIG. 1, an optical transceiver, generally indicated at 1, includes a transmitter optical sub-assembly (TOSA) 2 and a receiver optical sub-assembly (ROSA) 3, which are mounted on a printed circuit board 4. An optical connector 6 is disposed on one end of the optical transceiver 1, and includes an output port 7 for transmitting outgoing signals from the TOSA 2 and an input-port 8 for transmitting incoming signals to the ROSA 3. Ideally, the optical connector 6 is adapted to receive a conventional SC duplex optical connector, but any form of optical connector is within the scope of the invention. An electrical connector (not shown) is found on the other end of the optical transceiver 1 for electrically connecting the device to a printed circuit board in a host computer system. Typically, the electrical connector is in the form of electrical pins extending downwardly from the transceiver 1 through holes in the host computer's print circuit board for soldering thereto. Alternatively, the electrical connector can be in the form of a pluggable electrical connector, such as a card edge connector well known in the art.

The transceiver 1 is provided with a housing, which includes a rectangular open-topped lower portion 11 and a modular heat dissipating upper portion, generally indicated at 12. The lower portion 11 supports the printed circuit board 4, along with the TOSA 2 and the ROSA 3. The upper portion 12 includes a heat dissipating cover 13, which substantially encloses the lower portion 11, except for generally rectangular openings 14. The openings 14 are positioned directly adjacent, i.e. above, major heat sources 16. The upper portion 12 also includes extra heat sinking portions 17, one for each opening 14, i.e. one for each major heat source 16. Each heating sinking portion 17 includes a generally rectangular or frusto-pyramidal raised portion 18 for mating with an opening 14. The raised portion 17 extends through the opening 14 into proximity with the major heat source 16, and preferably into thermal contact therewith. The modular arrangement enables each heat sinking portion 17 to be tailored to the corresponding major heat source 16. In particular, the raised portions 18 can be designed and positioned in an optimum position without effecting the other heat sinking portions 17. Moreover, the form and material of each heat sinking portion 17 can be independently chosen to satisfy the thermal requirements of each major heat source 16. For example, the surface area of the heat sinking portions 17 can be increased by adding more or larger projections and/or the material making up the heat sinking portions 17, e.g. aluminum or copper, can be more thermally conductive than the material making up the heat dissipating cover 13. The material making up the heat dissipating cover 13, e.g. cast zinc, is selected more for its versatility, i.e. formability or workability, to facilitate manufacture of a lower cost cover, which requires more intricate detail. This is particularly advantageous for use in a large product line, in which one or more heat sinking portions 17 can be changed in response to different needs rather than redesigning the entire top cover 12.

Another feature of the present invention is the containment of electromagnetic interference (EMI). With the use of multiple heat sinks, there is the potential for EMI leakage; however, with the aforementioned modular design, an adhesive bond line with each heat sinking portion 17 can be controlled independently, thereby providing sufficient EMI protection. In particular, a solid thin bond line of thermal adhesive or other suitable gel, illustrated by broken line 19, is applied surrounding each hole 14 to contain EMI leakage and, if necessary, fix the heat sinking portions 17 to the cover 13. The heat sinking portions 17 may be press fit into the cover 13, whereby the bond line simply prevents EMI leakage.

Figure 2:
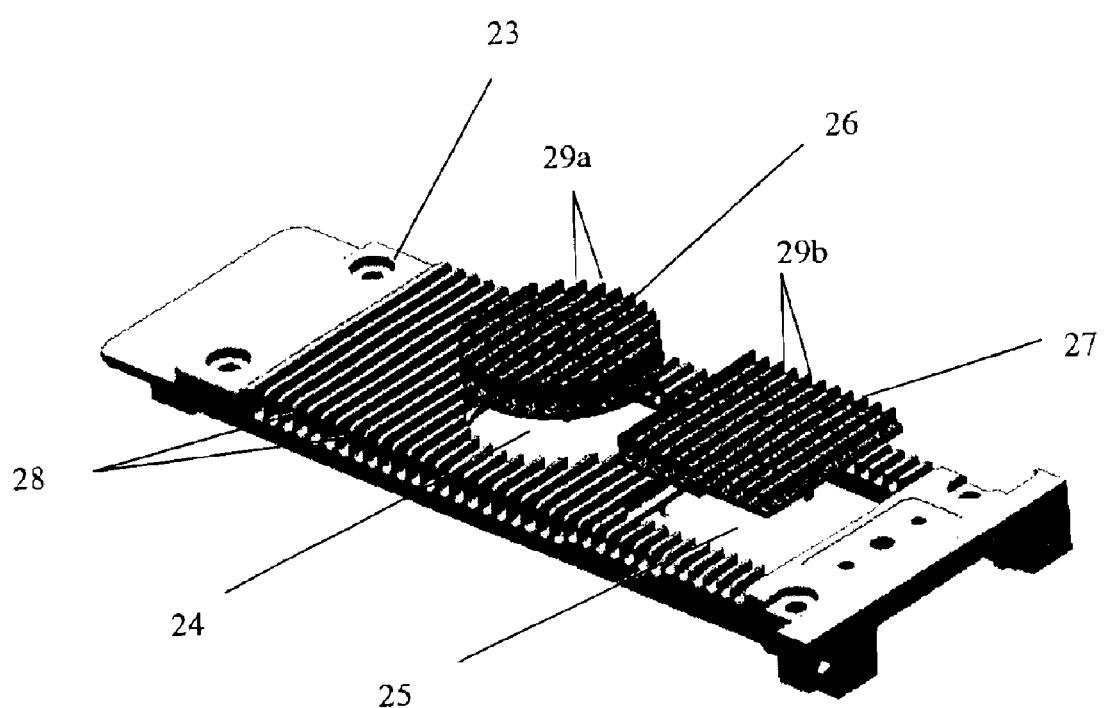
FIG. 2 is an exploded isometric view of a second embodiment of the present invention.

In an alternative embodiment, illustrated in FIG. 2, a heat dissipating cover 23, substantially encloses the rest of the transceiver housing (not shown) except for holes 24 and 25. A circular heat sinking portion 26 mates with heat dissipating cover 23 by fitting almost completely into the hole 24 for contact with a first major heat source (not shown), while a rectangular heat sinking portion 27 fits into the hole 25 for contact with a second major heat source or second and third major heat sources (not shown). As above, the heat sinking portions 26 and 27 are press fit into the holes 24 and 25, respectively, or they are fixed using a thermal adhesive or gel to ensure that the cover 23 and the heat sinking portions 26 and 27 are thermally connected and sealed against EMI leakage. Fins 28 or other raised projections are provided on the heat dissipating cover 23, while fins 29a and 29b or other raised projections are provided on the heat sinking portions 26 and 27, respectively, to increase the amount of heat dissipation. In a preferred embodiment, the heat sinking portions 26 and 27 are also formed of a material, e.g. aluminum, copper, which is more thermally conductive than the cover 23. The material for the cover 23 is chosen for strength as well as thermal conductivity. Furthermore, the size and shape of the fins 29a and 29b may also be different than those of the fins 28 to further increase heat dissipation.

Figure 3:
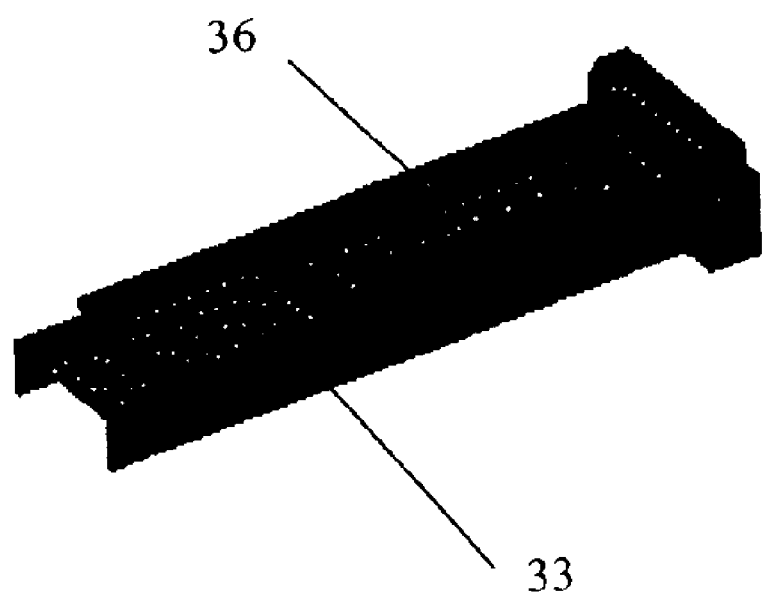
FIG. 3 is an isometric view of a third embodiment of the present invention.

FIG. 3 illustrates another embodiment of the present invention, in which an extra heat sinking portion 36 is inserted into the heat dissipating cover 33 during the casting process forming an integrated unit. One or more heat sinking portions 36 are made from a highly thermally conductive material, such as aluminum or copper, while the remaining cover 33 is molded from a more versatile material such as cast zinc, which is much easier to cast small features in. As before, the heat sinking portions 36 are positioned adjacent to, i.e. directly above and/or in thermal contact with, the major heat sources to maximize heat dissipation. Preferably, the heat sinking portions 36 and the cover 33 include raised projections, such as fins or pins (see FIG. 2), which extend upwardly providing additional surface area for convective cooling in the air stream.

Figure 4A:
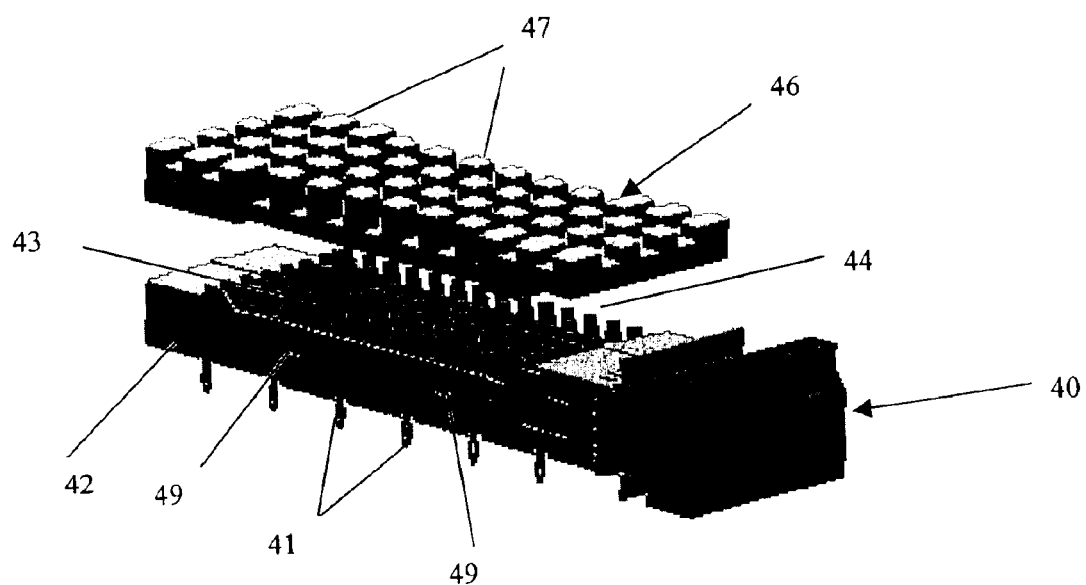
FIG. 4a is an isometric view of a fourth embodiment of the present invention installed in a suitable cage.
Figure 4B:
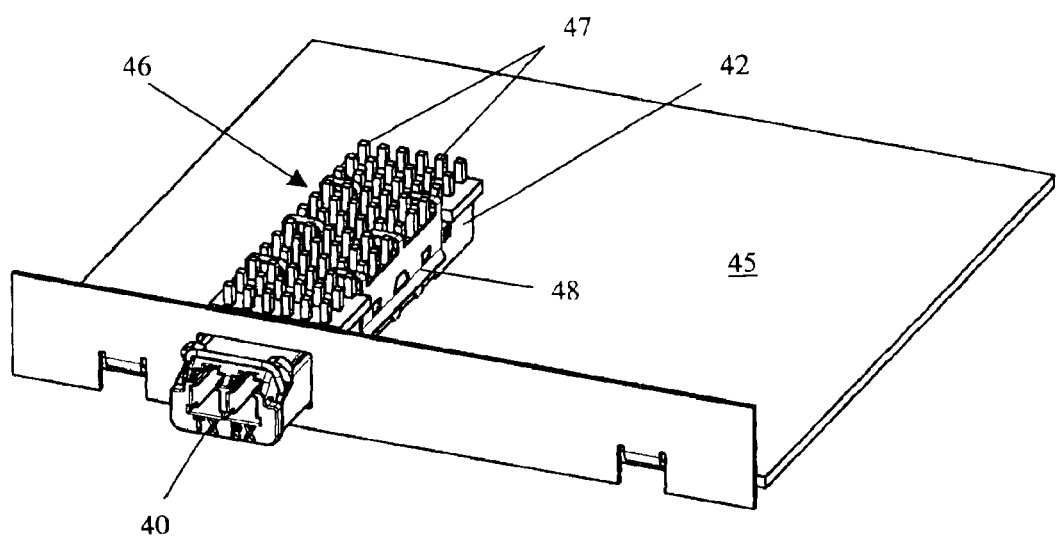
FIG. 4b is an isometric view of the embodiment of FIG. 4a mounted on a host computer circuit board.

In FIGS. 4a and 4b a pluggable transceiver 40 is illustrated mounted in a cage 42. Leads 41 extend downwardly from the cage 42 for connecting and grounding the cage 42 to a circuit board 45 of a host computer. The transceiver 40 includes a heat dissipating cover 43, which completely encloses the transceiver housing's lower portion providing the necessary EMI shielding. Pins 44 or other raised projections extend upwardly from the heat dissipating cover 43, and provide a first level of cooling within a given size restraint. For example, the pins 44 are capable of fitting through the opening of the cage 42, and provide adequate heat dissipation for lower power modules. When a greater amount of heat dissipation in required, e.g. for a higher power module, an extra heat sinking portion 46 is mounted on top off the cover 43. Preferably, the pins 44 are inserted into corresponding recesses in the heat sinking portion 46 to provide the best possible thermal connection. The greater amount of heat dissipation is preferably provided by wider and taller pins 47, although, as is hereinbefore described, the heat sinking portion 46 may also be made out of a material, which is more thermally conductive than the cover 43.

In the preferred embodiment illustrated in FIGS. 4a and 4b, the extra heat sinking portion 46 is mounted on top of the cage 42 after the transceiver 40 has been inserted therein. A spring clip 48 is used to secure the heat sinking portion 46 to the cage 42 on top of the transceiver 40. One end of the spring clip is interconnected to tabs 49 formed in the sides of the cage 42, while the other end of the spring clip 48 is comprised of spring fingers biasing the extra heat sinking portion 46 down onto the transceiver 40. Alternatively, the heat sinking portion 46 can be secured to the host printed circuit board 45 or to the host frame by a spring clip or other suitable means.

Figure 5:
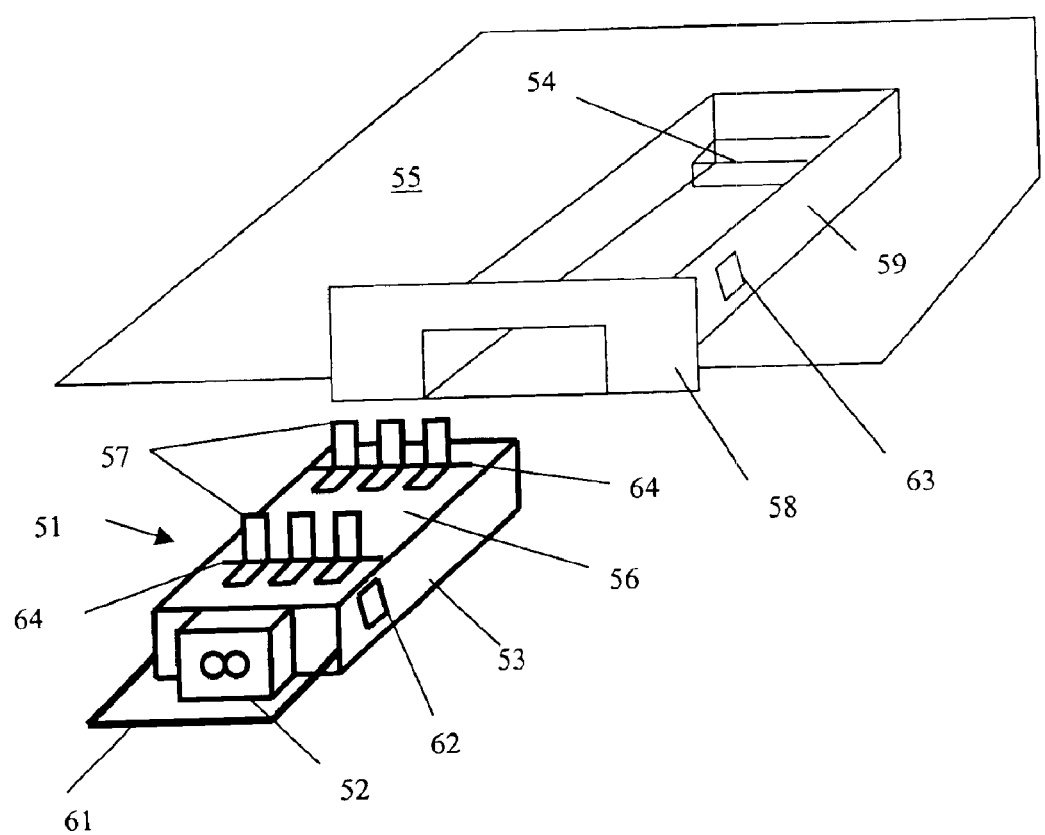
FIG. 5 is an isometric view of a fifth embodiment of the present invention.

With reference to FIG. 5, a pluggable transceiver 51 includes an optical coupler 52 and an electric coupler (not shown) mounted on housing 53. The optical coupler 52 connects a ROSA and a TOSA of the transceiver 51 with a suitable optical fiber communication line using a standard connector, e.g. SC or LC connector. The transceiver's electrical connector mates with a corresponding electrical connector 54 mounted on a printed circuit board 55 of a host device. The housing 53 includes a heat dissipating cover 56, which has extra heat sinking portions in the form of spring loaded pins or fins 57, which are preferably constructed from a material that is more thermally conductive than the material making up the heat dissipating cover 56. Preferably, the spring loaded pins 57 are removable, whereby they can be positioned above specific heat sources or evenly distributed over the cover 56. Typically, the spring loaded pins 57 are biased upwardly and get momentarily deflected downwardly into a retracted position by a faceplate 58 while the transceiver 51 is being inserted into a cage 59 mounted on the printed circuit board 55. After which, the spring loaded pins 57 resume their extended position in the flow of air to increase the amount of heat dissipation. Alternatively, the spring loaded pins 57 can be held in the retracted position by a mechanical lever, which can be actuated to release the spring loaded pins 57 after the transceiver 51 has been fully inserted into the cage 59. Ideally, the spring loaded pins 57 are actuated by the same mechanism that locks the transceiver 51 in the cage 59, e.g. a bail mechanism as disclosed in U.S. Pat. No 5,901,263, which is incorporat a bail 61, which is pivoted to disengage an arm 62 on the transceiver 40 from a hole 63 in the cage 59 or to disengage an arm on the cage 59 from a recess on the transceiver 40. Simultaneously, the rotation of the bail 61 causes the rotation or translation of linkage 64, which retract the pins 57 into a position parallel with the cover 56. When the transceiver 51 is fully inserted into the cage 59 and the bail 61 is rotated so that the cage 59 and the transceiver 51 are interlocked, the linkage 64 releases the pins 57, whereby they extend into their expanded position.

We claim:

1. An opto-electronic device of the type for transmitting signals between an optical waveguide and a host computer comprising:
   an optical sub-assembly for converting optical signals into electrical signals or electrical signals into optical signals;
   a thermally conductive housing for supporting the optical sub-assembly;
   an optical connector on one end of said housing for receiving the optical waveguide, and for aligning the optical waveguide with the optical sub-assembly;
   a printed circuit board mounted in said housing including circuitry for controlling the optical sub-assembly, the printed circuit board including a first heat source; and
   an electrical connector extending from another end of said housing for transmitting electrical signals between the printed circuit board and the host computer;
   wherein the housing includes:
      a lower portion for supporting the optical sub-assembly and the printed circuit board;
      a heat dissipating cover fixed on top of the lower portion for dissipating heat from inside the housing; and
      a first heat sink mounted on the heat dissipating cover above the first beat source for dissipating heat therefrom;
   wherein the heat dissipating cover or the first heat sink enclose and seal, the housing to prevent leakage of electro-magnetic interference (EMI) from the housing;
   wherein the first heat sink includes heat dissipating projections extending therefrom; and
   wherein the heat dissipating cover includes heat dissipating projections extending therefrom.

2. The device according to clam 1, wherein the heat dissipating cover is made of a first material, and the first heat sink is made of a second material, which is more thermally conductive than the first material.

3. The device according to claim 1, wherein the first heat sink and the heat dissipating cover include interlocking mating surfaces for fitting the first heat sink on the heat dissipating cover.

4. The device according to claim 1, wherein the heat dissipating cover includes an opening therethrough adjacent the heat sources; and wherein at least a portion of the first heat sink extends through the opening into proximity with the first heat source.

5. The device according to claim 4, wherein the first opening is surrounded by a bond line for attaching the first heat sink to the heat dissipating cover, while providing EMI protection.

6. The device according to claim 4, further comprising at least one additional opening in the heat dissipating cover, each opening for receiving at least a portion of an additional heat sink dissipating heat from an additional heat source.

7. The device according to claim 6, wherein bond lines surround each opening for attaching the heat sinks to the heat dissipating cover, while providing EMI protection; and wherein the first heat sink and the additional heat sinks substantially cover the heat dissipating cover.

8. The device according to claim 4, wherein substantially all of the first heat sink extends through the first opening for contacting the first heat source.

9. The device according to claim 8, wherein the entire peripheral edge of the first heat sink is thermally connected to the heat dissipating cover by one or more of the group consisting of an adhesive, a thermally conductive gel, and a friction fit.

10. The device according to claim 1, wherein the first heat sink covers substantially all of the heat dissipating cover.

11. The device according to claim 10, wherein the heat dissipating cover provides a first surface area for heat dissipation; and wherein the first heat sink includes projections on an upper surface thereof providing a second surface area for heat dissipation, which is greater than the first surface area.

12. The device according to claim 11, wherein the heat dissipating cover includes projections; and wherein the first heat sink includes recesses on a lower surface thereof for receiving the projections of the heat dissipating cover.

13. An opto-electronic device of the type for transmitting signals between an optical waveguide and a host computer comprising:
   an optical sub-assembly for converting optical signals into electrical signals or electrical signals into optical signals;
   a thermally conductive housing for supporting the optical sub-assembly;
   an optical connector on one end of said housing for receiving the optical waveguide, and for aligning the optical waveguide with the optical sub-assembly;
   a printed circuit board mounted in said housing including circuitry for controlling the optical sub-assembly, the printed circuit board including a first heat source; and
   an electrical connector extending from another end of said housing for transmitting electrical signals between the printed circuit board and the host computer;
   wherein the housing includes:
      a lower portion for supporting the optical sub-assembly and the printed circuit board;
      a heat dissipating cover fixed on top of the lower portion for dissipating heat from inside the housing; and
      a first heat sink mounted on the heat dissipating cover above the first heat source for dissipating heat therefrom;
   wherein the heat dissipating cover or the first heat sink enclose and seal the housing to prevent leakage of electro-magnetic interference (EMI) from the housing
   wherein the first heat sink is mounted over a cage system supporting the opto-electronic device on a circuit board of the host computer.

14. The device according to claim 13, further comprising a clip for biasing the first heat sink into contact with the heat dissipating cover; wherein the clip is mounted on the cage system or on the circuit board of the host computer.

15. An opto-electronic device of the type for transmitting signals between an optical waveguide and a host computer comprising:

an optical sub-assembly for converting optical signals into electrical signals or electrical signals into optical signals;

housing for supporting the optical sub-assembly;

an optical connector on one end of said housing for receiving the optical waveguide, and for aligning the optical wave guide with the optical sub-assembly;

a printed circuit board mounted in said housing including circuitry for controlling the optical sub-assembly, the printed circuit board including a first heat source; and an electrical connector extending from another end of said housing for transmitting electrical signals between the printed circuit board and the host computer;

wherein the housing includes:
- a lower portion for supporting the optical sub-assembly and the printed circuit board;
- a heat dissipating cover fixed on top of the lower portion for dissipating heat from inside the housing; and
- a first heat sink mounted on the heat dissipating cover above the first heat source for dissipating heat therefrom;

wherein the heat dissipating cover or the first heat sink enclose and seal the housing to prevent leakage of electro-magnetic interference (EMI) from the housing wherein the first heat sink includes a first fin resiliently biased away from the heat dissipating cover; wherein the first fin is retracted toward the heat dissipating cover into a retracted position during insertion of the device into the host computer, and extendable outwardly from the heat dissipating cover into an extended position, when the device is fully installed in the host computer.

16. The device according to claim 15, further comprising an actuator for holding the first fin in the retracted position, and for releasing the first fin into the extended position.

17. The device according to claim 16, further comprising a latching system for holding the device in a rail or cage system moveable between a first position engaged with the rail or cage system and a second position disengaged from the rail or cage system; wherein the latching system is interconnected with the actuator for releasing the first fin when the latching system is in the first position.

* * * * *

UNITED STATES PATENT AND TRADEMARK OFFICE
CERTIFICATE OF CORRECTION

PATENT NO. : 6,916,122 B2
DATED : July 12, 2005
INVENTOR(S) : Branch et al.

It is certified that error appears in the above-identified patent and that said Letters Patent is hereby corrected as shown below:

<u>Column 5,</u>
Line 6, "which is incorporat a bail" " should read -- which is incorporated herein by reference. The bail mechanism includes a bail --.
Line 44, "or" should read -- and/or --.
Line 61, "sources" should read -- source --.

<u>Column 6,</u>
Line 55, "or" should read -- and/or --.

<u>Column 7,</u>
Line 4, "housing" should read -- A housing --.

<u>Column 8,</u>
Line 1, "or" should read -- and/or --.

Signed and Sealed this

Twenty-first Day of March, 2006

JON W. DUDAS
*Director of the United States Patent and Trademark Office*